United States Patent [19]

Asahi et al.

[11] Patent Number: 5,115,468
[45] Date of Patent: May 19, 1992

[54] SSB DIGITAL MODULATOR

[75] Inventors: Nobumitsu Asahi, Sagamihara; Seiji Kawase, Yokohama, both of Japan

[73] Assignee: Kabushiki Kaisha Kenwood, Tokyo, Japan

[21] Appl. No.: 614,552

[22] Filed: May 9, 1990

Related U.S. Application Data

[63] Continuation of Ser. No. 204,756, Jun. 10, 1988, abandoned.

[30] Foreign Application Priority Data

Jun. 13, 1987 [JP] Japan .................................. 62-146246

[51] Int. Cl.⁵ .............................................. G10L 3/02
[52] U.S. Cl. ........................................ 381/31; 381/38; 364/724.17; 375/61
[58] Field of Search ............... 364/724.07, 724.09, 364/724.15, 724.16, 724.17, 724.19, 724.01; 381/29–35; 375/61

[56] References Cited

U.S. PATENT DOCUMENTS

| | | | |
|---|---|---|---|
| 3,152,305 | 10/1964 | Becker et al. | 375/61 |
| 3,196,359 | 7/1965 | Hopner et al. | 375/61 |
| 3,212,008 | 10/1965 | Kahn | 375/61 |
| 3,359,496 | 12/1967 | Burnsweig et al. | 375/61 |
| 3,825,834 | 7/1974 | Stuart et al. | 375/61 |
| 3,868,601 | 2/1975 | MacAfee | 375/61 |
| 4,297,533 | 10/1981 | Gander et al. | 364/724.09 |
| 4,302,817 | 11/1981 | Labedz | 364/724.09 |
| 4,586,174 | 4/1986 | Wong | 381/29 |

OTHER PUBLICATIONS

Hirano et al., "Design of Digital Notch Filters", IEEE Trans. on Communications, vol. COM-22, No. 7, Jul. 1974, pp. 964–967.

Abu-el-Haija, "A Structure for Digital Notch Filters", IEEE Trans. on ASSP, vol. ASSP-27, No. 2, Apr. 1979, pp. 193–195.

*Primary Examiner*—Dale M. Shaw
*Assistant Examiner*—David D. Knepper
*Attorney, Agent, or Firm*—Sixbey, Friedman, Leedom & Ferguson

[57] ABSTRACT

A digital SSB modulator in which an analog signal such as a vocal signal is temporarily converted to a digital signal, which is then subjected to SSB modulation using digital phase shifters and digital orthogonal amplitude modulators, and the resulting signal is converted back to an analog modulated signal. A digital filter may be provided after each digital phase shifter for eliminating direct-current signal components. Another digital filter may be provided after each digital orthogonal amplitude modulator for eliminating carrier signal components.

9 Claims, 3 Drawing Sheets

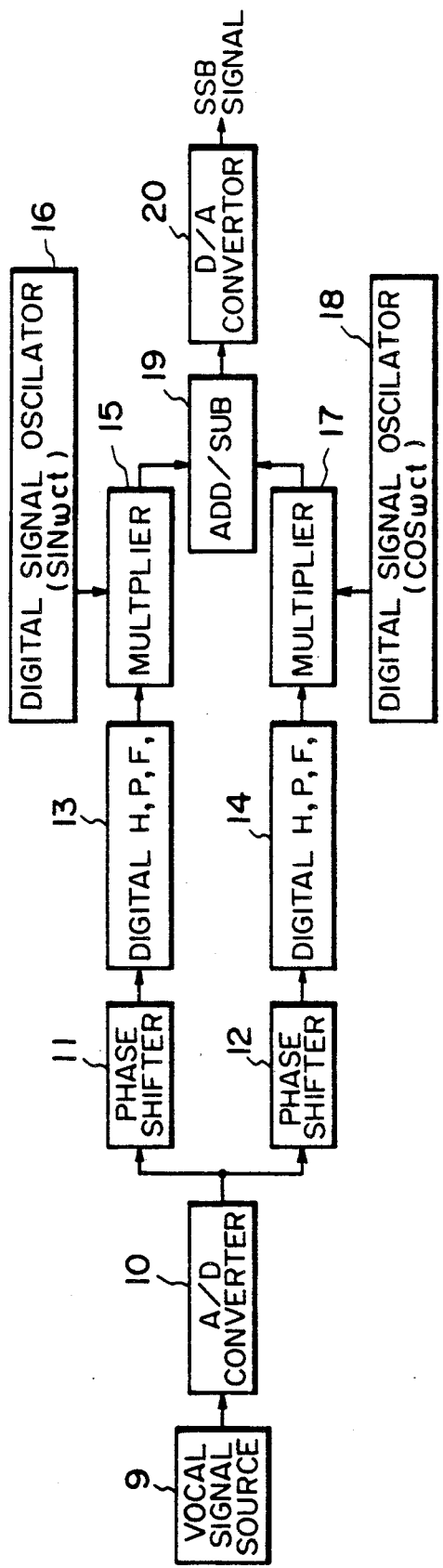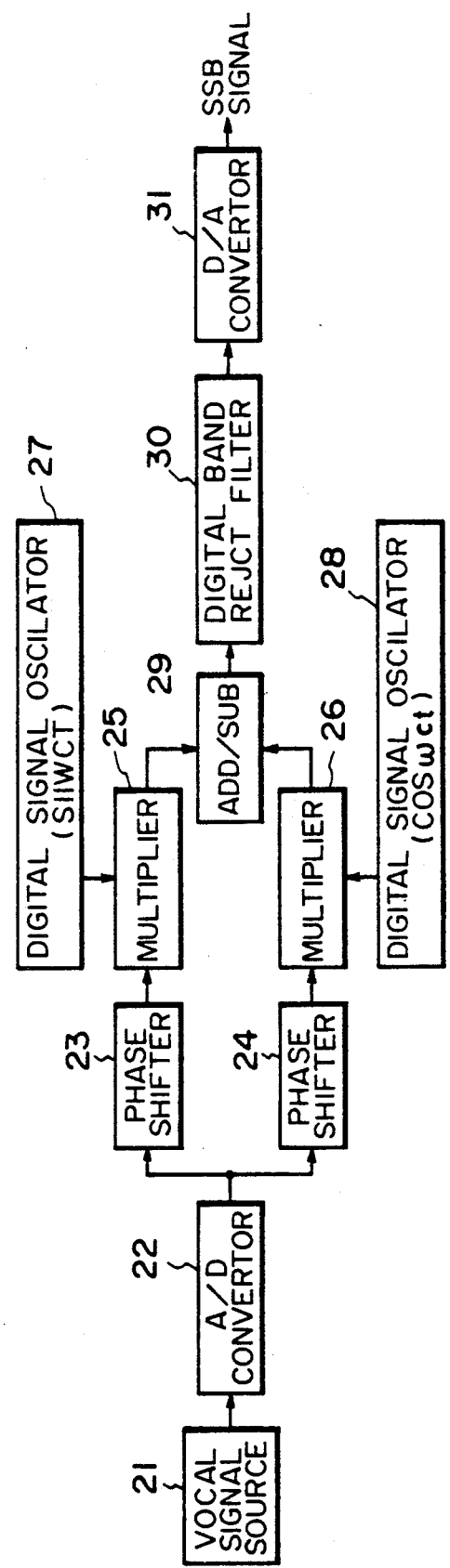

SSB DIGITAL MODULATOR

This application is a continuation of U.S. Pat. Ser. No. 07/204,756, filed Jun. 10, 1988, now abandoned.

FIELD OF THE INVENTION AND RELATED ART STATEMENT

The present invention relates to a SSB modulator of a digital signal processing type.

Conventionally, many SSB (Signal Side Band) modulators of an analog PSN (Phase Shift Network) type have been proposed. FIG. 1 is a block diagram of a SSB modulator of a PSN type. A vocal signal 1 is supplied to a pair of phase shifters 2 and 3. These phase shifters 2 and 3 perform a 90° phase difference shift between the output signals of those shifters in a required vocal band. Namely, the output signal $E_1$ from the phase shifter 2 is $\cos(\omega t + \phi)$ while the output signal $E_2$ from the phase shifter 3 is $\sin(\omega t + \phi)$. These output signals are supplied to multipliers 4 and 5.

The multipliers 4 and 5 multiply the phase shifter output signal $E_1$, $E_2$ by carrier signals $\sin \omega_c t$ and $\cos \omega_c t$ output from signal oscillators 4 and 5 and in orthogonal relationship, and perform balanced modulation on the signals. Thus the output signal $E_{out}$ from an adding/subtracting unit 8 is given by $$E_{out} = \cos(\omega t + \phi)\sin \omega_c t \pm \sin(\omega t + \phi)\cos \omega_c t$$

In this equation, when the second term takes a plus (+) sign, the output signal becomes a modulated SSB signal having an USB (Upper Side Band) while the term takes a minus (−) sign, the output signal becomes a SSB modulated signal having a LSB (Lower Side Band).

For example, the USB modulated signal is given by $$E_{out} = \cos(\omega t + \phi)\sin\omega_c t + \sin(\omega t + \phi)\cos\omega_c t = \sin((\omega + \omega_c)t + \phi)$$

The side bands are suppressed by forming a 90° phase difference between the outputs from the phase shifters 2 and 3, and the carrier is suppressed by balanced modulation at the multipliers 4 and 5 using carrier signals $\sin \omega_c t$ and $\cos \omega_c t$ from the signal oscillators 6 and 7, respectively.

On the other hand, in addition to this analog BBS modulator, a digital SSB modulator is also proposed. In the digital SSB modulator, a vocal analog signal is temporarily converted to a digital signal which is then shifted 90° by a digital phase shifter. A digital DSB (Double Side Band) signal free from the carrier is generated by a digital balanced modulator, and a USB or LSB digital SSB signal is output from an adding/subtracting unit. The resulting signal is converted by a D/A converter to an analog signal.

Since the digital SSB modulator performs a phase shift in a phase shifter in a digital signal processing system, the phase shift is accurately achieved to thereby provide a satisfactory side band suppression characteristic.

However, the above prior art analog SSB modulation system is difficult to generate two signals in 90° phase difference over a wide band, and cannot provide satisfactory side band suppression. The carrier suppression depends on the accuracy of the balanced modulator, so that the constants are likely to change depending on the ambient conditions. Thus the balanced conditions are likely to be broken and thus the carrier signal remains unsuppressed.

A notch filter would be able to be provided matching the carrier frequency in order to suppress the carrier, but the constants of the notch filter are likely to change depending on the ambient conditions. If the notch center frequency changes, the lower frequency portions of the modulated frequencies are attenuated by the notch filter and the modulated signal may disappear, so that the notch filter cannot be used.

Furthermore, in the prior art SSB modulator, the generation of the carrier components cannot be avoided due to a direct-current offset error in the A/D converter and/or an error in the arithmetic operation of the digital phase shifters.

In order to cope this, it would be conceivable to suppress the generated carrier signal by a digital notch filter. However, it is necessary to make sharp the filter characteristic in order to prevent damage to the original signal band of vocal signals, etc. In this case, amplification of noise and unstableness of the circuit operation due to noise in the operation of the phase shifters cannot be avoided.

SUMMARY OF THE INVENTION

The present invention derives from contemplation of the prior art problems. The object of present invention is to provide a digital SSB modulator of a digital PSN type which satisfactorily, suppresses the carrier components by eliminating direct-current components using a digital low cut filter in order to suppress the carrier frequency and/or directly suppressing the carrier using a digital band reject filter.

The digital SSB modulator according to the present invention comprises means for converting an analog vocal signal to a digital signal; a pair of digital phase shifters producing a 90° phase difference between the output signals from those shifters; a pair of multipliers for multiplying the outputs from the digital phase shifters by carrier signals having orthogonal relationships; means for digitally adding and subtracting the outputs from the multipliers; and means for converting the resulting digital modulated signal to an analog modulated signal, characterized by, a pair of digital bypass filters, one provided after each of the two digital phase shifters for eliminating direct current signal components.

The digital SSB modulator may include a digital band reject filter provided after the adding and subtracting means for suppressing the carrier. The digital SSB modulator is further characterized in that the digital bypass filter and the digital band reject filter include a digital sawtooth filter which greatly suppresses a limit cycle and an increase of quantized noise in the carrier position frequency due to the operation errors.

The use of a digital sawtooth filter as the digital band reject filter serves to realize a rapid carrier frequency position elimination characteristic without increasing the feedback constant of the digital filter significantly. Appropriate setting of the number of digital sawtooth filter registers D used and the value of a constant e representing the feedback gain serves to provide a sufficiently wide band of signal band components to thereby eliminate the DC components and carrier components.

BRIEF DESCRIPTION OF THE DRAWINGS

FIGS. 2 and 3 illustrate a first and a second embodiment, respectively, of a digital SSB modulator according to the present invention.

DETAILED DESCRIPTION OF PREFERRED EMBODIMENT

Figure 1:
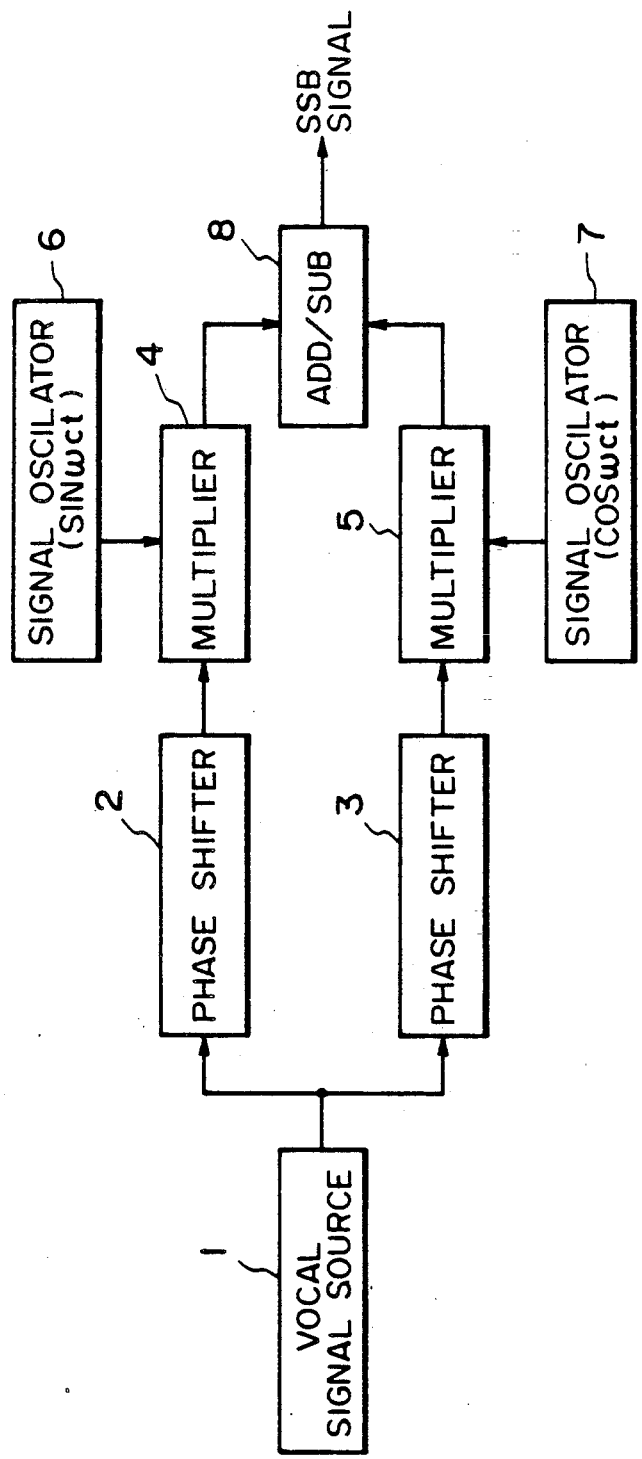
FIG. 1 is a block diagram of an SSB modulator of a prior art PSN system.

Embodiments of a digital SSB modulator according to the present invention will now be described with reference to FIGS. 2-5.

FIG. 2 is a block diagram of the digital SSB modulator. A vocal signal 9 which is a modulated signal is converted by an A/D converter 10 to a digital signal and provided to a pair of two digital phase shifters 11 and 12 which create a 90-degree phase difference between the output signals from those shifters in a required vocal frequency band. If the output signal from the phase shifter 11 is represented by $\sin(\omega t + \phi)$, the output signal from the phase shifter 12 is represented by $\cos(\omega t + \phi)$. These output signals are provided to digital high pass filters 13 and 14 to eliminate DC components to thereby prevent carrier leakage involving the resulting SSB signal.

Multipliers 15 and 17 multiply the output signals from the digital high pass filters 13 and 14 by the output signals from the digital signal oscillators 16 and 18, respectively, to perform a balanced modulation. The digital signal oscillators 16 and 18 provide to the multipliers 15 and 17 carrier signals $\sin \omega_c t$ and $\cos \omega_c t$ orthogonal to each other. The output signals from the multipliers 15 and 17 are added and subtracted by an adding and subtracting unit 19 to provide an SSB signal having a USB or LSB.

This digital SSB signal is converted by a D/A converter 20 to an analog SSB signal is then output.

FIG. 3 is a block diagram of a second embodiment. Instead of the digital high pass filters 13 and 14 of FIG. 2, a digital band reject filter 30 is provided after the adding and subtracting unit 29.

The SSB signal having a USB or LSB produced by the adding and subtracting unit 29 is suppressed by the digital band reject filter 30 adjusted directly to the carrier frequency and the resulting signal is converted by a D/A converter 31 to an analog SSB signal which is then output.

The digital high pass filters 13 and 14 used in FIGS. 2 and 3 may be realized by a digital sawtooth filter. The specific circuit structure of the digital sawtooth filter is shown in FIG. 4.

Figure 4:
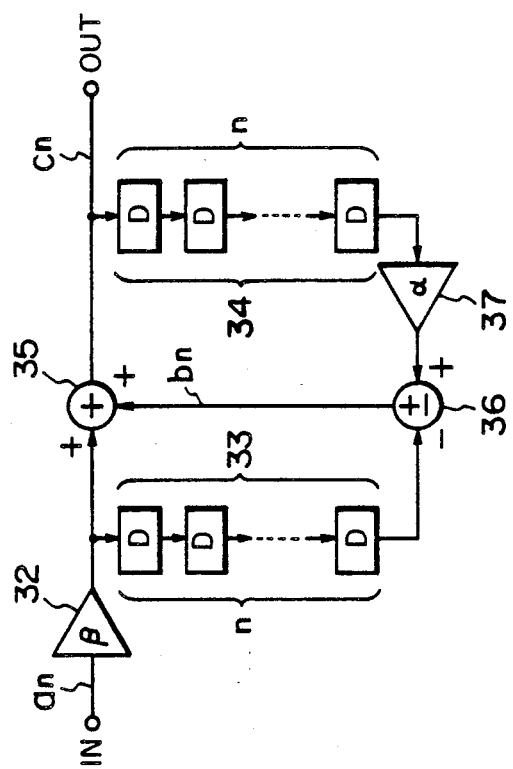
FIG. 4 is a circuit diagram of a sawtooth filter.

As shown in FIG. 4, the sawtooth filter according to the present invention includes a first delay unit 33 comprising n registers D whose quantity of delay is n/fx, a second delay unit 34 having the same quantity of delay as the first delay unit, multipliers 32 and 37 having constant multiplicative factors $\alpha$ and $\beta$, an adder 35 and a subtactor 36.

An input digital signal $a_n$ is multiplied by $\beta$ and then input to the first delay unit 33. The output signal from the first delay unit 33 and the output $b_n$ from the subtractor 36 are added by the adder 35 to provide an output $\beta a_i + b_i$ which is represented as the sawtooth filter output $c_i$ of the sawtooth filter. The output $c_i$ is input to the second delay unit 34. The subtractor 36 subtracts the output $\beta a_{i-n}$ of the first delay unit 33 from the second delay unit output multiplied by $\alpha$, $\alpha c_{i-n}$. The relationship between the signals $a_i$ and $c_i$ in the series of above operations is represented by the following difference equation:

$$-\alpha a_{i-n} + \alpha c_i + \beta a_i = c_i \qquad (1)$$

Performing the z-transformation of both sides of the equation, the transfer function ($z^{-1}$—function) representing the input-output relationship of the digital sawtooth filter and the frequency response functions thereof are represented by the following equations (2) and (3):

$$S(z^{-1}) = \frac{1+\alpha}{2} \cdot \frac{1 - z^{-n}}{1 - \alpha \cdot z^{-n}} \qquad (2)$$

$$S(e^{-jwn/fs}) = \frac{1+\alpha}{2} \cdot \frac{1 - e^{-jwn/fs}}{1 - \alpha \cdot e^{-jwn/fs}} \qquad (3)$$

Where fs is the sample frequency.

The amplitude-frequency characteristic of the filter is obtained by calculating the absolute value of the equation (3) as follows:

$$|S(e^{-jwn/fs})| = \left| \frac{1+\alpha}{2} \cdot \frac{1 - e^{-jwn/fs}}{1 - \alpha \cdot e^{-jwn/fs}} \right|$$

$$= \frac{1+\alpha}{2} \sqrt{\frac{2 - 2\cos(\omega \cdot n/fs)}{1 + \alpha^2 - 2\alpha\cos(\omega \cdot n/fs)}} \qquad (4)$$

The equation (4) shows a characteristic in which the absolute value becomes the "0" level at a frequency of m/n fs (m is 0 or any natural number). This characteristic is shown as a graph in FIG. 5 wherein the axis of abscissas represents frequency and the axis of ordinates represents a level.

Figure 5:
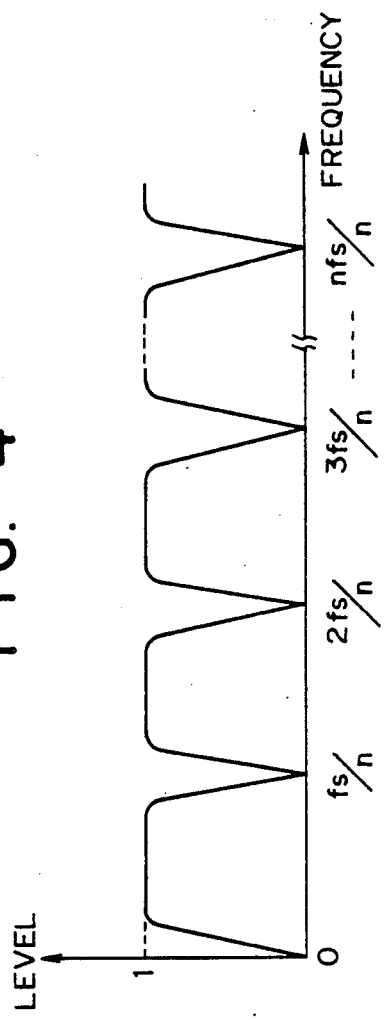
FIG. 5 is a frequency characteristic diagram of a digital sawtooth filter.

As is clear from FIG. 5, the frequency characteristic includes valley-like characteristic sections arranged at equal intervals in which the levels become 0 at m/n times the sample frequency fs.

If the sample frequency fs is constant, the inclination of the sidewalls of the vally-like caves in the frequency characteristic become sharp if the multiplicative factor or the feedback gain $\alpha$ of the multiplier 35 of the digital sawtooth filter as well as the number of series connected registers D21, n, is large. Thus, it is possible to render sharp the filter cut-off characteristic by increasing only n while the constant $\alpha$ is set to a value smaller than 1 (unity). In this case, the proportion of the pass band relative to the attenuation band becomes small, so that it is necessary to select the number of the digital sawtooth filter registers D, n, so as to satisfy the following conditions if the filter is used to eliminate the DC components of the SSB signal having a signal band width $\Delta F$ or to eliminate the carrier component after modulation:

(a) If the direct current components of the SSB $$fs/n > \Delta F \quad n < fs/\Delta F \qquad (5)$$

(b) If the carrier components of the SSB signal are eliminated:

$$m/n\, fs = fc \quad n = m\, fs/fc \qquad (6)$$

$$fc/n > \Delta F \quad n < fs/\Delta F \qquad (7)$$

For example, if the carrier components of a SSB signal having a pass band width F=3 kHz are eliminated, if the sample frequency fs=50 kHz, and if the carrier frequency fs=12.5 kHz, n is given as follows by the equation (6):

$$n = m \times \frac{50 \text{ KHz}}{12.5 \text{ KHz}} = 4m$$

IF $m = 1, 2, 3, \ldots$, then $n = 4, 8, 12, 16, \ldots$

From the equation (7), $$n < \frac{50 \text{ KHz}}{3 \text{ KHz}} = 16.66 \ldots$$

The number n satisfying both the equations (6) and (7) takes four values; namely, n=4, 8, 12, 16. It is requisite to select n among these values.

If the constant α representing the feedback gain of the multiplier 23 is fixed, the pass band width ΔF becomes minimum at n=16 and maximum at n=4 while the sharpness of inclination of the sidewalls of the valley-like caves in the frequency characteristic becomes maximum at n=16 and minimum at n=4. Therefore, if the flat pass area is increased, it is necessary to increase n to 16.

When n is constant, it is naturally possible to increase the sharpness of inclination of the sidewalls of the valley-like caves in the frequency characteristic by increasing constant α representing the feedback gain to thereby increase the flat pass band area. However, if constant α is increased toward 1 (unity), the operation error in the digital sawtooth filter increases to thereby increase quantized noise in the vicinity of the carrier frequency or increase a quantity of feedback and hence the circuit is likely to operate in an unstabilized manner.

Therefore, in actual design, in order to realize a digital SSB modulator which suppresses the carrier greatly, the circuit constants, the number of filter registers, n, and the feedback gain α involving the circuit structure should be determined by considering a balance among the band width of a modulated signal, the limitation of the circuit scale, the filter frequency characteristic, and the circuit stability.

In the digital SSB modulator according to the present invention, signal processing such as phase shifting, multiplication, addition/subtraction and filtering is all performed by digital signals, so that the use of an IC (one chip) structure and a digital signal processor serves to reduce the cost and space.

The accuracy in design of the frequency suppressed by the digital filter and the accuracy of a quantity of phase shift in the phase shifters are very high compared to the analog system. Therefore, sufficient side band suppression characteristic is obtained.

The occurrence of carriers due to a direct offset error in the A/D converter and an error in the operation of the digital phase shifters is positively suppressed by the digital filters. Therefore, the carrier suppression characteristic is greatly improved to thereby maintain a stabilized characteristic without being influenced by aging and by changes in the ambient conditions in use.

The modulator according to the present invention is simple in structure and constructed inexpensively and easily.

What is claimed is:

1. A digital single sideband modulator for producing a carrier suppressed single sideband signal of a signal bandwidth ΔF and carrier frequency fc, the modulator comprising:
an analog to digital converter for converting an analog baseband signal into a digital baseband signal;
modulation means for taking a multiplication of the digital baseband signal with two orthogonal carriers to produce a digital signal sideband signal; and
a digital to analog converter for converting the digital single sideband signal produced by said modulation means into an analog single sideband signal;
wherein said modulation means includes a digital sawtooth filter provided with an n stage delay element and feedback loop, n being an integer equal to or larger than 2 and the frequency response of the filter having dips at a plurality of equally spaced frequencies for suppressing a residual carrier signal component in the digital single sideband signal prior to the conversion by said digital to analog converter and said digital to analog converter converts the digital single sideband signal from which the residual carrier signal component has been suppressed by said digital sawtooth filter.

2. A digital single sideband modulator according to claim 1, wherein said dips are positioned at frequencies of 0, fs/n, 2fs/n . . . mfs/n, where fs is a sampling frequency, and m is a positive integer less than n/2.

3. A digital single sideband modulator according to claim 1, wherein said modulation means includes a 90° phase shift means and an orthogonal amplitude multiplier means in a series and said digital sawtooth filter is inserted between the shift means and multiplier means to reduce a DC signal component in the phase shifted digital baseband signal due to an offset error in said analog to digital converter.

4. A digital single sideband modulator according to claim 1, wherein said digital sawtooth filter is inserted between said modulation means and digital to analog converter to reduce the carrier signal component in the modulated digital signal due to an arithmetic operation error in the modulating means.

5. A digital single sideband modulator according to claim 1, wherein said n is selected so as to satisfy an inequality of fs/n>ΔF where fs is a sampling frequency.

6. A digital signal sideband modulator according to claim 5, wherein n is the maximum one among integers which satisfy the inequality of fs/n>ΔF.

7. A digital single sideband modulator according to claim 1, wherein said carrier frequency fc is either one among frequencies of fs/n, 2fs/n −mfs/n, where m is the maximum positive integer less than n/2 for a preselected n.

8. A digital single sideband modulator for producing a carrier suppressed single sideband signal of a signal bandwidth ΔF and carrier frequency fc, the modulator comprising:
input means for inputting a digital baseband signal;
digital sawtooth filter means provided with an n stage delay element and feedback loop, n being an integer equal to or larger than 2 and the frequency response of the filter having dips at a plurality of equally spaced frequencies for eliminating DC components in the input digital baseband signal; and modulation means for taking a multiplication of the digital baseband signal from which the DC components have been eliminated by said digital sawtooth filter means, with two orthogonal carriers to produce a digital single sideband signal.

9. A digital single sideband modulator for producing a carrier suppressed single sideband signal of a signal bandwidth $\Delta F$ and carrier frequency fc, the modulator comprising:

input means for inputting a digital baseband signal;
modulation means for digitally taking a multiplication of the input digital baseband signal with two orthogonal carriers to produce a digital single sideband signal; and
a digital sawtooth filter provided with an n stage delay element and feed back loop, n being an integer equal to or larger than 2 and the frequency response of the filter having dips at a plurality of equally spaced frequencies, and in response to the digital single sideband signal produced by said modulation means for eliminating a residual carrier frequency component in the digital single sideband signal.

* * * * *